United States Patent
Shim et al.

(10) Patent No.: US 8,923,063 B2
(45) Date of Patent: Dec. 30, 2014

(54) MEMORY CONTROLLER EQUIPPED WITH A COMPENSATION CIRCUIT FOR SUPPLYING AN ADDITIONAL POWER TO A MEMORY DEVICE AND USER SYSTEM INCLUDING THE SAME

(71) Applicant: Samsung Electronics Co., Ltd., Suwon-si (KR)

(72) Inventors: In Bo Shim, Osan-si (KR); Cheol Kwon, Suwon-si (KR); Iksung Park, Seoul (KR); Jong-Wook Jeong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/068,746

(22) Filed: Oct. 31, 2013

(65) Prior Publication Data
US 2014/0133241 A1   May 15, 2014

(30) Foreign Application Priority Data
Nov. 12, 2012 (KR) .......................... 10-2012-0127594

(51) Int. Cl.
*G11C 16/30* (2006.01)
*G11C 16/22* (2006.01)

(52) U.S. Cl.
CPC .............. *G11C 16/30* (2013.01); *G11C 16/22* (2013.01)
USPC ............ 365/185.18; 365/185.33; 365/189.09; 365/189.07; 365/228

(58) Field of Classification Search
USPC ............... 365/189.09, 189.07, 229, 228, 226, 365/185.18, 185.33
See application file for complete search history.

(56) References Cited

U.S. PATENT DOCUMENTS

| | | | |
|---|---|---|---|
| 5,671,179 A * | 9/1997 | Javanifard | ................. 365/185.33 |
| 5,818,781 A * | 10/1998 | Estakhri et al. | ................ 365/226 |
| 6,535,449 B2 | 3/2003 | Miyauchi | |
| 6,901,012 B2 | 5/2005 | Ikehashi et al. | |
| 7,702,935 B2 | 4/2010 | Cornwell et al. | |
| 7,706,204 B2 | 4/2010 | Choi et al. | |
| 8,230,257 B2 | 7/2012 | Wilson | |
| 2010/0153625 A1 | 6/2010 | Sugita et al. | |
| 2012/0112795 A1 | 5/2012 | Wang et al. | |
| 2013/0207695 A1* | 8/2013 | Jeon et al. | ...................... 327/109 |

FOREIGN PATENT DOCUMENTS

| | | |
|---|---|---|
| JP | 2007-094963 | 4/2007 |
| JP | 2010-191740 | 9/2010 |
| KR | 2012-0038853 A | 4/2012 |

\* cited by examiner

*Primary Examiner* — Andrew Q Tran
(74) *Attorney, Agent, or Firm* — Myers Bigel Sibley & Sajovec (57) ABSTRACT

A user system is provided including a plurality of flash memory devices and a memory controller connected to the flash memory devices through a plurality of channels. The memory controller includes a voltage regulator configured to supply a power of the flash memory devices and a compensation unit configured to supply an additional power to the flash memory devices when a power required by the flash memory devices exceeds a predetermined level. The compensation unit includes a resistor unit connected to an output terminal of the voltage regulator and input terminals of the flash memory devices and a charging unit connected to input terminals of the flash memory devices. The charging unit is configured to supply an additional power to the flash memory devices according to voltages of input terminals of the flash memory devices.

18 Claims, 8 Drawing Sheets

MEMORY CONTROLLER EQUIPPED WITH A COMPENSATION CIRCUIT FOR SUPPLYING AN ADDITIONAL POWER TO A MEMORY DEVICE AND USER SYSTEM INCLUDING THE SAME

CROSS-REFERENCE TO RELATED APPLICATION

The present application claims priority under 35 U.S.C. §119 to Korean Patent Application No. 10-2012-0127594, filed Nov. 12, 2012 in the Korean Intellectual Property Office, the entire contents of which are hereby incorporated herein by reference as if set forth in its entirety.

FIELD

The inventive concept relates generally to semiconductor devices and, more particularly, to memory controllers that control semiconductor memory devices.

BACKGROUND

A semiconductor memory device stores data using semiconductor elements. Semiconductor memory devices may be volatile memory devices, such as a DRAM and an SRAM and the like, or nonvolatile memory devices, such as an EEPROM, an FRAM, a PRAM, an MRAM, a flash memory, and the like. While a volatile memory device may lose data stored therein when the device is powered off, a nonvolatile memory device may retain data stored therein even when powered off.

In recent years, the integration degree of semiconductor memory devices has been improved with development of semiconductor integration technology. Thus, the capacity of the semiconductor memory device may increase. In particular, a flash memory system may be widely used as a storage medium of a computing system by virtue of merits such as a fast programming speed, a mass storage capacity, and the like.

To improve the capacity and operating speed of the flash memory system, a plurality of flash memory devices may be used. In this case, a power exceeding an allowable power of a power supply device of a host connected with a flash memory device may be used. This may mean that a power of the host and the flash memory device becomes unstable. An operation of the flash memory device may be limited by the unstable power. Thus, the performance of the flash memory system may be decreased.

SUMMARY

Some embodiments of the inventive concept provide a user system including a plurality of flash memory devices; and a memory controller connected to the plurality of flash memory devices through a plurality of respective channels. The memory controller includes a voltage regulator configured to supply power of the plurality of flash memory devices. The memory controller further includes a compensation unit configured to supply additional power to the flash memory devices when a power required by the flash memory devices exceeds a predetermined threshold. The compensation unit includes a resistor unit connected to an output terminal of the voltage regulator and input terminals of the plurality of flash memory devices. The compensation unit further includes a charging unit connected to input sides of the plurality of flash memory devices and configured to supply additional power to the flash memory devices according to voltages of input terminals of the plurality of flash memory devices.

In further embodiments, the charging unit may be an energy storage medium connected between the input terminals of the plurality of flash memory devices and a terminal ground.

In still further embodiments, the compensation unit may further include a comparison unit configured to compare voltages of both ends of the resistor unit; and a switching unit connected between the charging unit and the flash memory devices and configured to operate responsive to an output of the comparison unit. The switching unit may be turned on when a voltage difference between both ends of the resistor unit is over a predetermined level and may be turned off when a voltage difference between both ends of the resistor unit is below the predetermined level.

In some embodiments, the comparison unit may include a differential amplifier configured to amplify a voltage difference between both ends of the resistor unit; and a Schmitt trigger configured to output a control signal in response to an output of the differential amplifier.

In further embodiments, the Schmitt trigger may output a first control signal when an output voltage of the differential amplifier is higher than a first threshold voltage and a second control signal when an output voltage of the differential amplifier is higher than a second threshold voltage, the first threshold voltage being higher than the second threshold voltage.

In still further embodiments, the first and second threshold voltages may be set based on an operating voltage range of the flash memory devices.

In some embodiments, the switching unit may be turned on when an output of the comparison unit is a first control signal and turned off when an output of the comparison unit is a second control signal.

In further embodiments, the user system may further include an auxiliary power device configured to supply an auxiliary power to the flash memory devices, and the compensation unit may supply additional power to the plurality of flash memory devices using a power stored at the auxiliary power device.

Still further embodiments of the present inventive concept provide a memory controller include a voltage regulator configured to supply a power to an external memory device; and a compensation unit configured to supply an additional power to the external memory device when a power required by the external memory device increases. The compensation unit includes a resistor unit connected between an output terminal of the voltage regulator and an input terminal of the external memory device; and a charging unit connected to an input side of the external memory device and configured to supply an additional power to the external memory device according to a voltage of the input side of the external memory device.

In some embodiments of the inventive concept, a compensation unit may distribute a peak power of a user system. Furthermore, duplication of a memory device may be possible by distributing a peak power. Thus, the performance of the user system may be improved.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF EMBODIMENTS

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the event that a power required by flash memory devices increases, a user system according to the inventive concept may supply additional power stored at a charging unit. In other words, the performance of the flash memory device may be improved by distributing a peak power generated when a plurality of memory devices performs a read, write or erase operation at the same time. Although a flash memory based user system will be discussed herein, it will be understood that embodiments of the inventive concept are not limited thereto. For example, the user system according to the inventive concept may be configured to be based on semiconductor memory devices, such as a DRAM, an SRAM, an MRAM, an RRAM, an FRAM, and the like.

Figure 1:
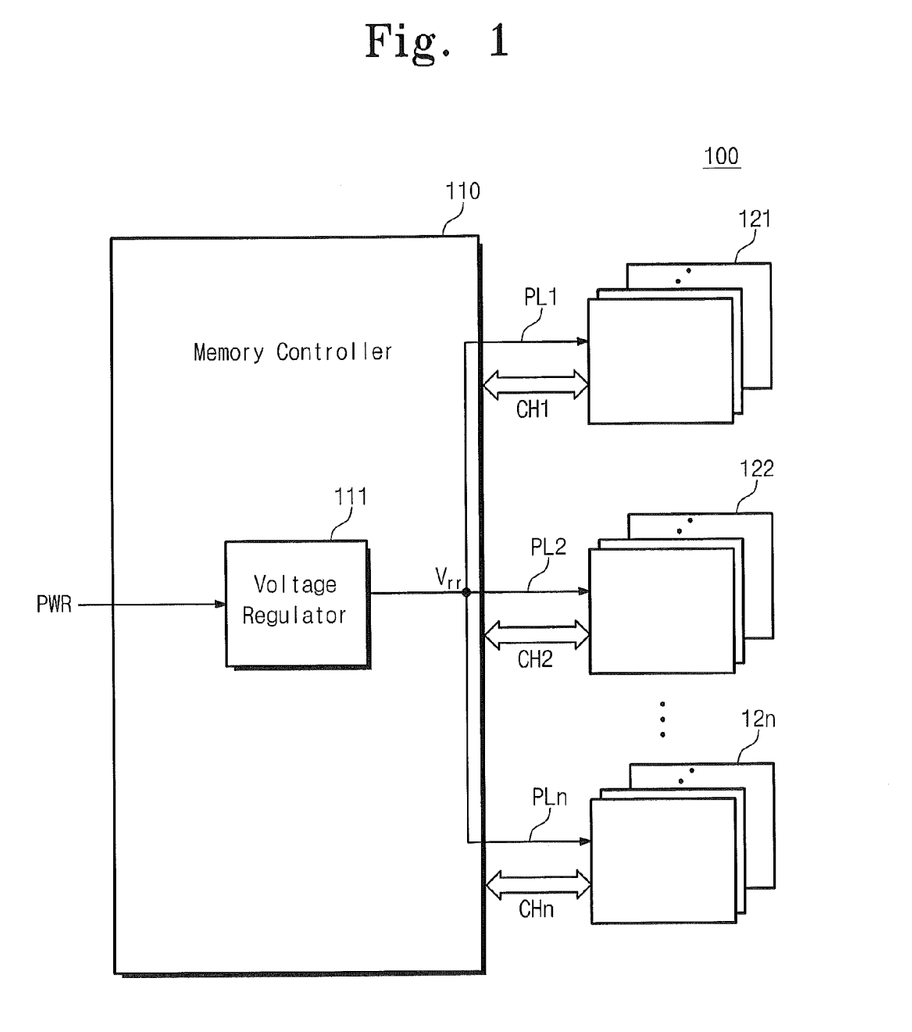
FIG. 1 is a block diagram schematically illustrating a user system including a plurality of flash memory device groups in accordance with some embodiments of the present inventive concept.

Referring to FIG. 1, a block diagram schematically illustrating a user system 100 including a plurality of flash memory device groups 121 to 12n will be discussed. The user system 100 may be implemented by a computing system, such as a personal computer, a notebook computer, a smart phone, a personal digital assistant (PDA), a camera, and so on. The user system 100 may be devices, included in a computing system or electrically connected thereto, such as a storage device, an input device, an output device, and the like. Below, it is assumed that the user system 100 is a NAND flash memory based flash memory system. However, it will be understood that the inventive concept is not limited thereto. A device included in the user system may be, for example, one of devices (MRAM, RRAM, DRAM, SRAM, HDD, graphic card, etc.) that are included in the user system or are electrically connected thereto so as to be supplied with a power.

As illustrated in FIG. 1, the user system 100 may include a memory controller 110 and a plurality of flash memory device groups 121 to 12n. The memory controller 110 may receive power PWR, address, and data from host. The memory controller 110 may control the flash memory device groups 121 to 12n based on the received power PWR, address, and data.

The memory controller 110 may include a voltage regulator 111. The voltage regulator 111 may generate a voltage Vrr using a power PWR from an external device (e.g., host) to provide it to the flash memory device groups 121 to 12n. For example, the voltage regulator 111 may have a constant voltage characteristic. The constant voltage characteristic may indicate such a characteristic that a fixed voltage having a constant level is output. That is, the voltage regulator 111 may maintain a constant level of the output voltage Vrr through a feedback loop. The voltage regulator 111 may supply a power required by the flash memory device groups 121 to 12n through power lines PL1 to PLn.

The memory controller 110 may be connected to the flash memory device groups 121 to 12n through a plurality of channels CH1 to CHn. The memory controller 110 may exchange signals, for example, addresses, data, commands, control signals, and the like, with the flash memory device groups 121 to 12n through the channels CH1 to CHn.

Each of the flash memory device groups 121 to 12n may include a plurality of flash memory devices. For example, the flash memory device group 121 may be connected with the memory controller 110 through a first channel CH1. A plurality of flash memory devices may operate independently from one another.

Figure 2:
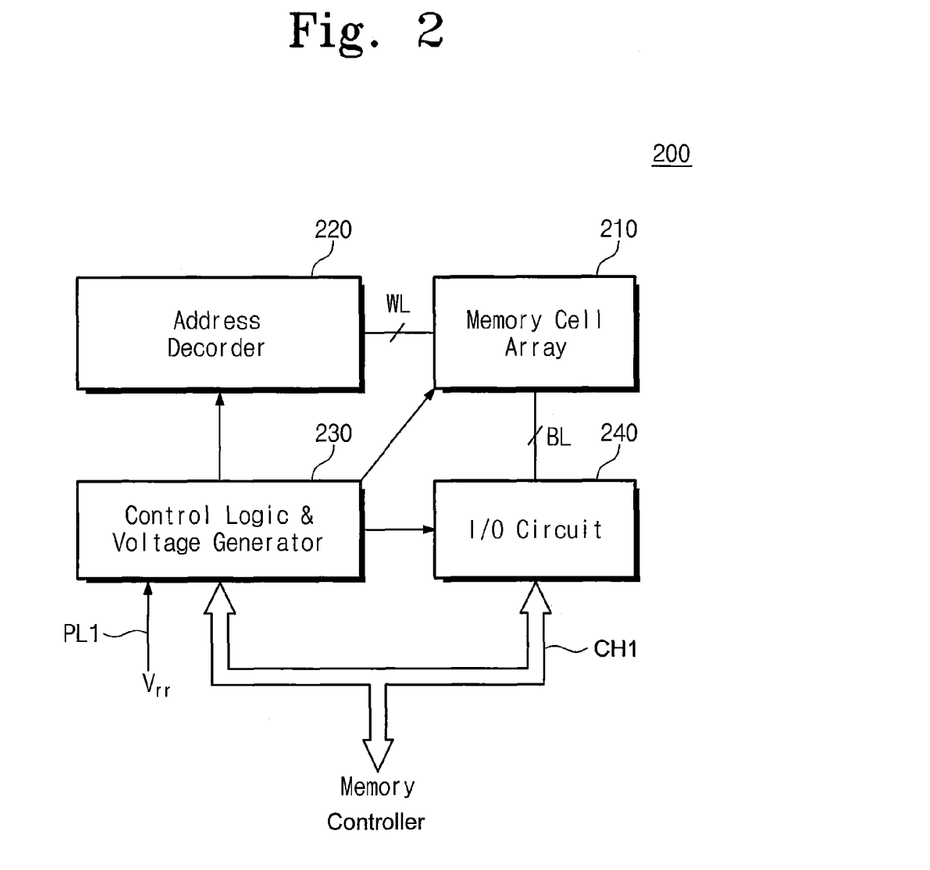
FIG. 2 is a block diagram schematically illustrating a flash memory device included in a flash memory device group 121 of FIG. 1.

Referring now to FIG. 2, a block diagram schematically illustrating a flash memory device included in a flash memory device group 121 of FIG. 1 will be discussed. The flash memory device 200 may be connected to a memory controller 110 through a first channel CN1. A plurality of flash memory devices included in flash memory device groups 121 to 12n may include the same components as those of the flash memory device 200 illustrated in FIG. 2. As illustrated in FIG. 2, the flash memory device 200 may include a memory cell array 210, an address decoder 220, control logic and voltage generator block 230, and an input/output circuit 240.

The memory cell array 210 may include a plurality of memory blocks. The memory cell array 210 may include a plurality of pages. A page may indicate a group of memory cells connected to a word line.

The address decoder 220 may be connected to the memory cell array 210 through word lines WL. During a program or read operation, the address decoder 220 may select one word line in response to an input address.

The control logic and voltage generator block 230 may generate a word line voltage needed for a data reading or writing operation using a voltage Vrr from the memory controller 110. The control logic and voltage generator block 230 may control program, read, and erase operations of the flash memory device 200. For example, control logic 230 may control the address decoder 220 and the input/output circuit 240 in response to signals, for example, an address, a command, and the like, from the memory controller 110. The control logic and voltage generator block 230 may supply the word line voltage to the memory cell array 210. The control logic and voltage generator block 230 may be supplied with the voltage Vrr through a power line PL1 from a voltage regulator 111.

The input/output circuit 240 may be configured to input and output data. For example, the input/output circuit 240 may read data from the memory cell array 210 via a bit line BL to transfer it to the memory controller 110.

Figure 3:
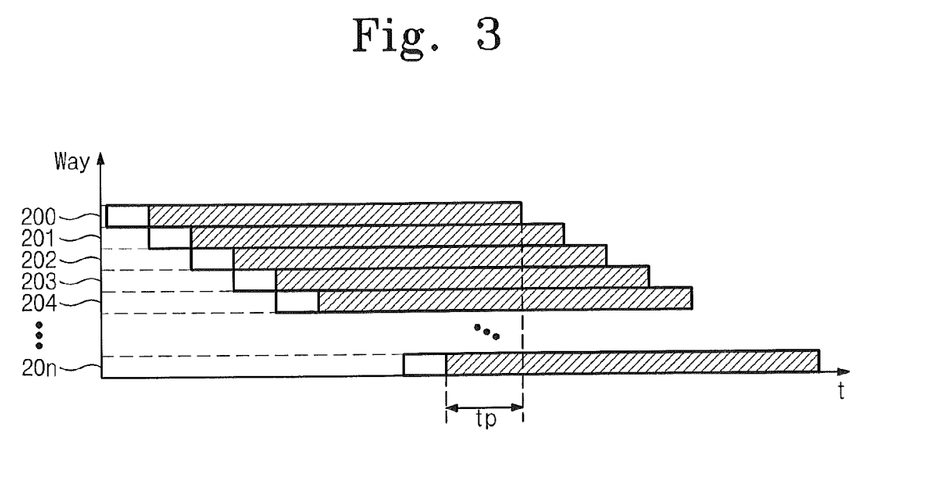
FIG. 3 is a diagram illustrating operating characteristics of a flash memory device group, connected through a first channel, from among a plurality of flash memory device groups of FIG. 1.

Referring now to FIG. 3, a diagram illustrating an operating characteristic of a flash memory device group 121, connected through a first channel CH1, from among a plurality of flash memory device groups 121 to 12n of FIG. 1 will be discussed. A plurality of flash memory devices 200 to 20n included in a flash memory device group 121 may include components of a flash memory device 200 illustrated in FIG. 2. Flash memory device groups 122 to 12n connected through the remaining channels CH2 to CHn may have an operating characteristic illustrated in FIG. 3.

As illustrated in FIG. 3, data program/read/erase operations of the flash memory devices 200 to 20n included in the flash memory device group 121 may be overlapped. The flash memory devices 200 to 20n may be connected to a first channel CH1. Power required by a user system 100 may increase at a period where operations of the flash memory device 200 to 20n are overlapped. In other words, in the event that program operations of n flash memory device 200 to 20n are overlapped, a power required by a plurality of flash memory devices may have a maximum value during a peak time tp.

Power supplied to the flash memory device 200 to 20n may be provided from a voltage regulator 111. The voltage regulator 111 may have a constant voltage characteristic. In the event that power required by the flash memory device 200 to 20n gets out of a driving range of the voltage regulator 111, for example, when it exceeds an allowable current amount of a voltage regulator or when an excessive load power is required, however, a noise may be generated at an output voltage Vrr of the voltage regulator 111. For example, during the peak time tp, the flash memory device 200 to 20n may require a power larger than a maximum power of the voltage regulator 111. In these embodiments, the reliability of a user system 100 may be lowered. Furthermore, operations of the flash memory device 200 to 20n may be limited to stabilize an output of the voltage regulator 111.

Likewise, in the event that program, read, or erase operations of flash memory device groups 121 to 12n are performed at the same time, the flash memory device groups 121 to 12n may require a power larger than a maximum power of the voltage regulator 111.

Figure 4:
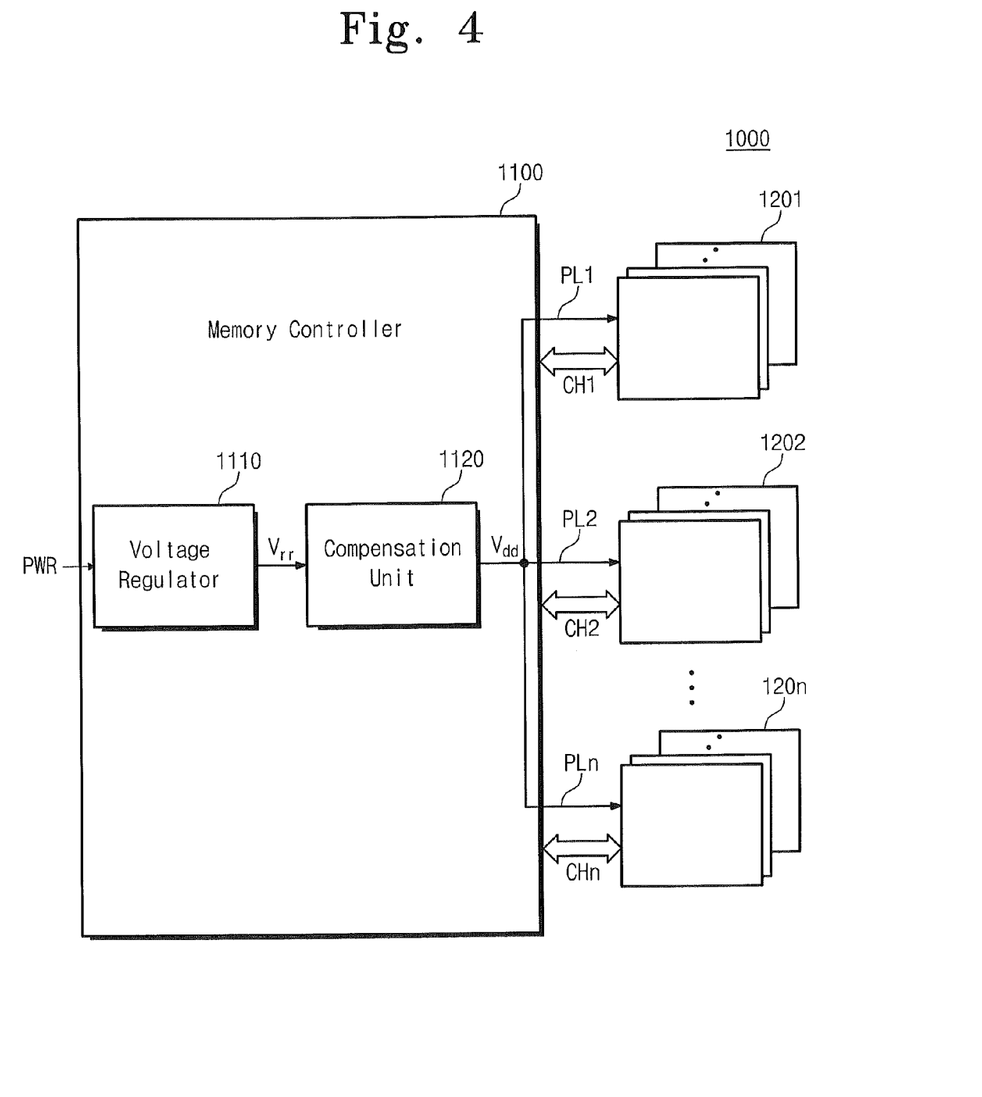
FIG. 4 is a block diagram schematically illustrating a user system according to some embodiments of the present inventive concept.

Referring to FIG. 4, a block diagram schematically illustrating a user system according to some embodiments of the inventive concept will be discussed. Compared with a user system 100 of FIG. 2, a user system 1000 of FIG. 4 may further include a compensation unit 1120.

As illustrated in FIG. 4, the user system 1000 may include a memory controller 1100 and a plurality of flash memory device groups 1201 to 120n. The memory controller 1100 and the flash memory device groups 1201 to 120n may be interconnected through a plurality of channels CH1 to CHn. The memory controller 1100 may include a voltage regulator 1110 and a compensation unit 1120. The voltage regulator 1110 and the flash memory device groups 1201 to 120n may be substantially the same as those described with reference to FIG. 2, and a description thereof will not be repeated herein in the interest of brevity.

The compensation unit 1120 may supply an additional power to the flash memory device groups 1201 to 120n. For example, as illustrated in FIG. 3, if a maximum power is consumed by simultaneous operations of the flash memory device groups 1201 to 120n during a peak time tp, the compensation unit 1120 may supply an additional power. The additional power may indicate a power having a predetermined constant level. An operation of the compensation unit 1120 will be more fully described with reference to FIGS. 5 and 6.

Figure 5:
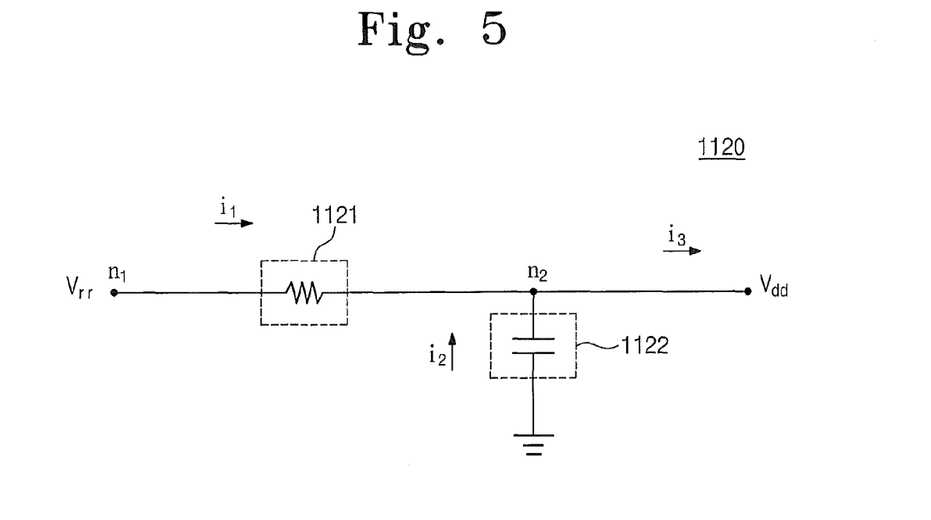
FIG. 5 is a circuit diagram schematically illustrating a compensation unit according to some embodiments of the present inventive concept.

Referring to FIG. 5, a circuit diagram schematically illustrating a compensation unit 1120 according to some embodiments of the inventive concept will be discussed. A first node n1 of a compensation unit 1120 may indicate an output terminal of a voltage regulator 1110, and a second node n2 may indicate input terminals of flash memory devices 1201 to 120n.

Referring to FIG. 5, the compensation unit 1120 may include a resistor unit 1121 and a charging unit 1122. The resistor unit 1121 may be connected between the first node n1 and the second node n2. The resistor unit 1121 may include a resistor for forcibly dropping a voltage. For example, in the event that a user system 1000 includes flash memory devices arranged in an 8-way and 8-channel structure, a resistance value of a resistor included in the resistor unit 1121 may be about 50~150 mohm.

One end of the charging unit 1122 may be connected to the second node n2 and the other end thereof may be grounded. The charging unit 1122 may charge an output voltage Vrr of the voltage regulator 1110. For example, the charging unit 1122 may be implemented by an energy storage medium, for example, a super capacitor, a tantalum capacitor, a battery, and the like, capable of storing electric energy.

Below, it is assumed that flash memory device groups 1201 to 120n operate based on an operating characteristic illustrated in FIG. 3. In other words, the flash memory device groups 1201 to 120n may operate at the same time during a peak time tp.

In operation of the compensation unit 1120, a power required by the flash memory device groups 1201 to 120n may increase when the flash memory device groups 1201 to 120n perform program, read, or erase operations at the same time. In these embodiments, a first current $i_1$ supplied from the voltage regulator 1110 may increase. As the first current $i_1$ increase, the resistor unit 1121 may generate a forced voltage drop. At this time, a voltage of the second node n2 may become lower than a voltage of the first node n1. Also, a voltage of the charging unit 1122 may become higher than a voltage of the second node n2. In these embodiments, the charging unit 1122 may supply a second current $i_2$ to the flash memory device groups 1201 to 120n through the second node n2. Since a third current i3 corresponding to a sum of the first and second currents i1 and i2 is supplied to the flash memory device groups 1201 to 120n, the flash memory device groups 1201 to 120n may be stably supplied with power.

In some embodiments of the present inventive concept, the compensation unit 1120 may reduce a peak power burden of the voltage regulator 1110 using the charging unit 1122 when the flash memory device groups 1201 to 120n require power over a predetermined level. Thus, the stability of a user system 1000 may be improved. Furthermore, since operations of flash memory devices are not limited for system stability, the performance of the user system 1000 may be improved.

Figure 6:
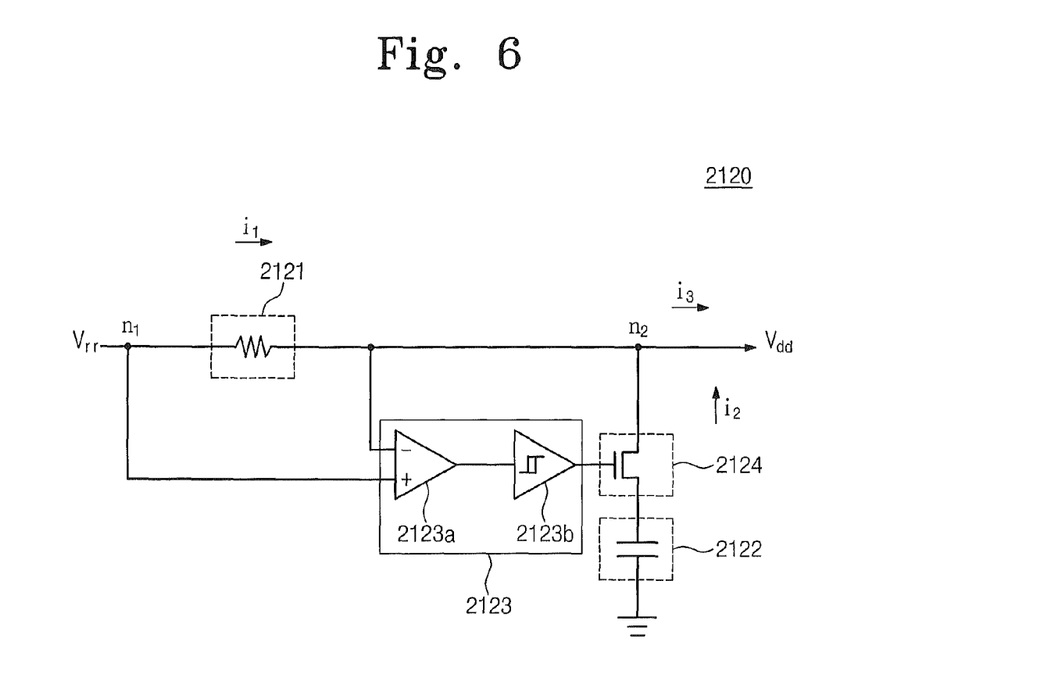
FIG. 6 is a circuit diagram schematically illustrating a compensation unit according to some embodiments of the present inventive concept.

Referring now to FIG. 6, a circuit diagram schematically illustrating a compensation unit according to some embodiments of the present inventive concept will be discussed. As illustrated in FIG. 6, a compensation unit 2120 may include a resistor unit 2121, a charging unit 2122, a comparison unit 2123, and a switching unit 2124. Compared with a compensation unit 1120 of FIG. 5, a compensation unit 2120 of FIG. 6 may further include the comparison unit 2123 and the switching unit 2124. The resistor unit 2121 and the charging unit 2122 may be substantially the same as those in FIG. 5 and, thus, details thereof may be omitted in the interest of brevity.

The comparison unit 2123 may include a differential amplifier 2123a and a Schmitt trigger 2123b. The differential amplifier 2123a may amplify a voltage difference of both ends of the resistor unit 2121.

The Schmitt trigger 2123b may output a pulse signal in response to an output of the differential amplifier 2123a. The Schmitt trigger 2123b may have a hysteresis characteristic of an input to an output. For example, the Schmitt trigger 2123b may output a first control signal in response to a first threshold voltage. The Schmitt trigger 2123b may output the first control signal until a voltage of an input signal reaches a second threshold voltage. The Schmitt trigger 2123b may output a second control signal in response to the second threshold voltage. The Schmitt trigger 2123b may output the second control signal until a voltage of the input signal reaches the first threshold voltage. In these embodiments, the first threshold voltage may be higher by a predetermined level than the second threshold voltage.

The first and second threshold voltages of the Schmitt trigger 2123b may be decided based on a driving voltage range of flash memory devices. For example, in the event that a user system 2000 has an 8-way and 8-channel structure, the first threshold voltage of the Schmitt trigger 2123b may be about 0.5V and the second threshold voltage thereof may be about 0.4V. If a voltage forcibly dropped by the resistor unit 2121 is over 0.5V, the comparison unit 2123 may output the first control signal. If a voltage forcibly dropped by the resistor unit 2121 is below 0.4V, the comparison unit 2123 may output the second control signal.

The switching unit 2124 may operate responsive to an output of the comparison unit 2123. For example, the switching unit 2124 may be turned off when the comparison unit 2123 outputs the first control signal and turned on when the comparison unit 2123 outputs the second control signal.

According to some embodiments of the present inventive concept, the compensation unit 2120 may distribute a peak power generated during operations of flash memory devices. Thus, the reliability and performance of the user system may be improved.

Figure 7A:
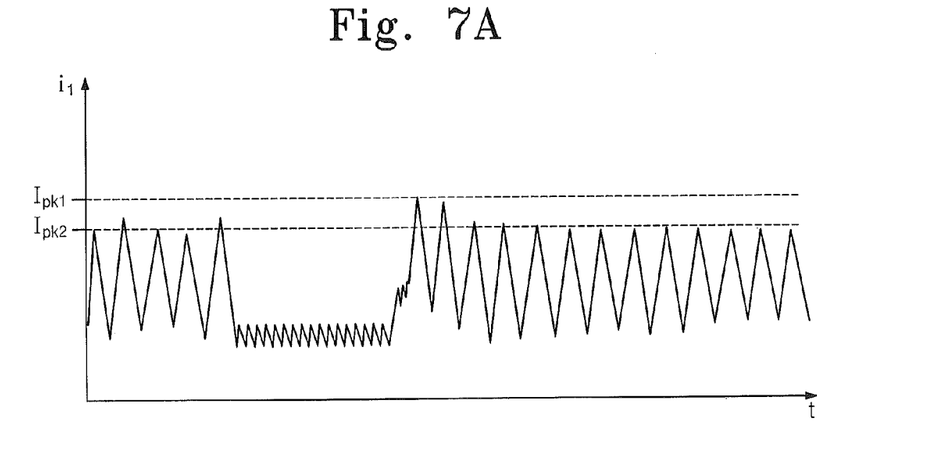
FIGS. 7A and 7B are graphs illustrating an additional power compensation effect of a user system according to some embodiments of the present inventive concept.
Figure 7B:
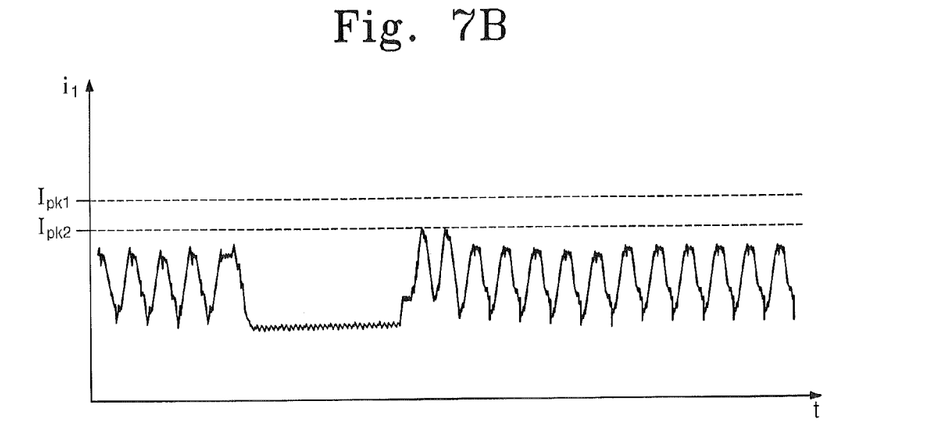

Referring now to FIGS. 7A and 7B, graphs illustrating additional power compensation effect of a user system according to some embodiments of the inventive concept will be discussed. FIGS. 7A and 7B show output currents of a voltage regulator supplied with an external power of 5V. In some embodiments, FIG. 7A shows an output current of a voltage regulator to which a compensation unit of the inventive concept is not applied. FIG. 7B shows an output current of a voltage regulator to which a compensation unit of the inventive concept is applied. In FIGS. 7A and 7B, a horizontal axis may indicate a time (ms), and a vertical axis may indicate a current (mA) output from a voltage regulator.

As illustrated in FIGS. 7A and 7B, a peak current $I_{pk2}$ of a user system including a compensation unit may be lower than a peak current $I_{pk1}$ illustrated in FIG. 7A. In other words, a peak power provided from an external power supply device may be reduced by providing an additional power from the compensation unit to flash memory devices. Since operations of the flash memory devices are not limited, the performance of the user system may be improved.

Figure 8:
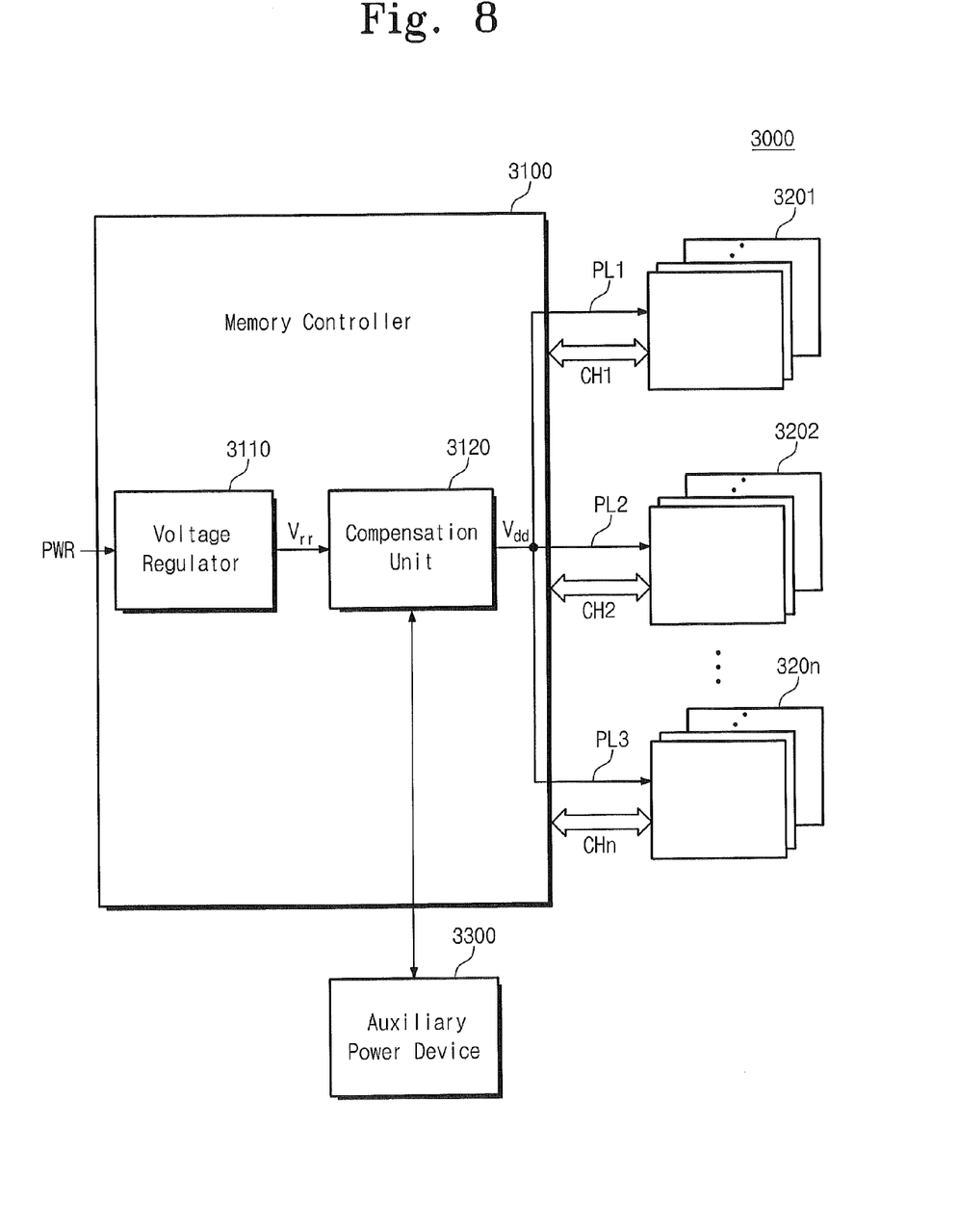
FIG. 8 is a block diagram schematically illustrating a user system according to some embodiments of the present inventive concept.

Referring now to FIG. 8, a block diagram schematically illustrating a user system according to some embodiments of the inventive concept will be discussed. Compared with a user system of FIG. 3, a user system 300 of FIG. 8 may further include an auxiliary power device 3300.

As illustrated in FIG. 8, the user system 3000 may include a memory controller 3100, a plurality of flash memory device groups 3101 to 310n, and an auxiliary power device 3300. The memory controller 3100 may include a voltage regulator 3110 and a compensation unit 3120. Since the memory controller 3100, the flash memory device groups 3101 to 310n, the voltage regulator 3110, and the compensation unit 3120 are discussed with respect to FIGS. 4 to 6, details thereof will omitted in the interest of brevity.

To reduce the likelihood of a variation of data stored at flash memory devices or system damage due to sudden power-off (SPO), the auxiliary power device 3300 may supply a temporary power to the flash memory device groups 3101 to 310n at the SPO.

In some embodiments, a charging unit described with reference to FIGS. 5 and 6 can be replaced with the auxiliary power device 3300. In other words, the compensation unit 3120 may supply an additional power to the flash memory device groups 3101 to 310n using a power stored at the auxiliary power device 3300.

A compensation unit included in a user system of FIG. 8 may compensate for a part of a required power using an auxiliary power device when a power required by flash memory devices is over a predetermined value. Thus, the power supply of the user system may be stabilized, and the performance of the user system may be improved.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A user system, comprising:
   a plurality of flash memory devices; and
   a memory controller connected to the plurality of flash memory devices through a respective plurality of channels,
   wherein the memory controller comprises:
      a voltage regulator configured to supply power to the plurality of flash memory devices; and
      a compensation unit configured to supply an additional power to the plurality of flash memory devices when a required power of the plurality of flash memory devices exceeds a threshold; and
   wherein the compensation unit comprises:
      a resistor unit connected to an output terminal of the voltage regulator and input terminals of the plurality of flash memory devices; and
      a charging unit connected to the input terminals of the plurality of flash memory devices and configured to supply the additional power to the plurality of flash memory devices according to voltages of input terminals of the plurality of flash memory devices.

2. The user system of claim 1, wherein the charging unit comprises an energy storage medium connected between the input terminals of the plurality of flash memory devices and a ground terminal.

3. The user system of claim 1, wherein the compensation unit further comprises:
   a comparison unit configured to compare voltages at both ends of the resistor unit and provide an output; and
   a switching unit connected between the charging unit and the plurality of flash memory devices and configured to operate responsive to the output of the comparison unit.

4. The user system of claim 3, wherein the switching unit is turned on when the output indicates that a voltage difference between both ends of the resistor unit is over a predetermined threshold and is turned off when the output indicates that the voltage difference between both ends of the resistor unit is below the predetermined threshold.

5. The user system of claim 3, wherein the comparison unit comprises:
   a differential amplifier configured to amplify a voltage difference between both ends of the resistor unit; and
   a Schmitt trigger configured to output a control signal in response to the output of the differential amplifier.

6. The user system of claim 5, wherein the Schmitt trigger outputs a first control signal when the output voltage of the differential amplifier is higher than a first threshold voltage and a second control signal when the output voltage of the differential amplifier is higher than a second threshold voltage, the first threshold voltage being higher than the second threshold voltage.

7. The user system of claim 6, wherein the first and second threshold voltages are set based on an operating voltage range of the plurality of flash memory devices.

8. The user system of claim 7, wherein the switching unit is turned on when the output of the comparison unit is the first control signal and the switching unit is turned off when the output of the comparison unit is the second control signal.

9. The user system of claim 1, further comprising:
   an auxiliary power device configured to supply an auxiliary power to the plurality of flash memory devices, wherein the compensation unit supplies the additional power to the plurality of flash memory devices using power stored at the auxiliary power device.

10. A memory controller, comprising:
    a voltage regulator configured to supply a power to an external memory device; and
    a compensation unit configured to supply an additional power to the external memory device when a required power for the external memory device increases,
    wherein the compensation unit comprises:
       a resistor unit connected between an output terminal of the voltage regulator and an input terminal of the external memory device; and
       a charging unit connected to an input side of the external memory device and configured to supply the additional power to the external memory device according to a voltage of the input side of the external memory device.

11. The memory controller of claim 10, wherein the external memory device comprises a plurality of flash memory devices and wherein the charging unit comprises an energy storage medium connected between the input terminals of the plurality of flash memory devices and a ground terminal.

12. The memory controller of claim 11, wherein the compensation unit further comprises:
    a comparison unit configured to compare voltages at both ends of the resistor unit and provide an output; and
    a switching unit connected between the charging unit and the plurality of flash memory devices and configured to operate responsive to the output of the comparison unit.

13. The memory controller of claim 12, wherein the switching unit is turned on when the output indicates that a voltage difference between both ends of the resistor unit is over a predetermined threshold and is turned off when the output indicates that the voltage difference between both ends of the resistor unit is below the predetermined threshold.

14. The memory controller of claim 12, wherein the comparison unit comprises:
    a differential amplifier configured to amplify a voltage difference between both ends of the resistor unit; and a Schmitt trigger configured to output a control signal in response to an output of the differential amplifier.

15. The memory controller of claim 14, wherein the Schmitt trigger outputs a first control signal when the output voltage of the differential amplifier is higher than a first threshold voltage and a second control signal when the output voltage of the differential amplifier is higher than a second threshold voltage, the first threshold voltage being higher than the second threshold voltage.

16. The memory controller of claim 15, wherein the first and second threshold voltages are set based on an operating voltage range of the plurality of flash memory devices.

17. The memory controller of claim 16, wherein the switching unit is turned on when the output of the comparison unit is the first control signal and the switching unit is turned off when the output of the comparison unit is the second control signal.

18. The memory controller of claim 11, further comprising:
   an auxiliary power device configured to supply an auxiliary power to the plurality of flash memory devices, wherein the compensation unit supplies the additional power to the plurality of flash memory devices using power stored at the auxiliary power device.

* * * * *